United States Patent

[11] 3,616,089

[72] Inventor Albert W. Zemek
Binghamton, N.Y.
[21] Appl. No. 849,842
[22] Filed Aug. 13, 1969
[45] Patented Oct. 26, 1971
[73] Assignee Universal Instruments Corporation
Binghamton, N.Y.

[54] PREPPER-TAPER MACHINE FOR ELECTRICAL COMPONENTS
15 Claims, 27 Drawing Figs.

[52] U.S. Cl. .......... 156/552, 140/147, 156/297, 156/522
[51] Int. Cl. .......... B32b 31/10, B21f 1/02
[50] Field of Search .......... 156/306, 522, 552, 297; 140/147; 53/198; 198/35

[56] References Cited

UNITED STATES PATENTS

| | | | |
|---|---|---|---|
| 3,082,859 | 3/1963 | Hagner et al. | 198/135 |
| 3,122,179 | 2/1964 | Zimmerman et al. | 140/147 |
| 3,186,447 | 6/1965 | Wilson et al. | 140/147 |
| 3,315,436 | 4/1967 | Baum et al. | 156/522 X |
| 3,344,816 | 10/1967 | Zemek | 140/147 |
| 3,421,284 | 1/1969 | Zemek | 156/552 |
| 3,520,336 | 7/1970 | Zemek | 140/147 |

*Primary Examiner*—Benjamin A. Borchelt
*Assistant Examiner*—James M. Hanley
*Attorney*—Fidelman, Wolffe & Leitner

ABSTRACT: A machine for receiving unprocessed electrical components from a feed mechanism, straightening the leads, forming the leads of the components by bending them in opposite directions within the same plane, feeding the components with their formed leads onto the adhesive side of two tapes mounted on taping wheels, the oppositely bent leads contacting separate taping wheels, applying second covering tapes to seal the leads between the adhesive surfaces of the tapes and winding the taped components onto a drum.

INVENTORS
ALBERT W ZEMEK

BY Fidelman, Wolffe & Leitner
ATTORNEYS

INVENTORS
ALBERT W. ZEMEK

BY Fidelman, Wolffe and Leitner
ATTORNEYS

INVENTORS
ALBERT W. ZEMEK

Fidelman, Wolffe & Leitner
ATTORNEYS

INVENTORS
ALBERT W. ZEMEK

BY Fidelman, Wolffe & Leitner
ATTORNEYS

INVENTORS
ALBERT W. ZEMEK

BY Fidelman, Wolffe & Leitner
ATTORNEYS

INVENTORS
ALBERT W. ZEMEK

BY Fidelman, Wolffe & Leitner
ATTORNEYS

INVENTORS
ALBERT W. ZEMEK

BY Fidelman, Wolffe & Leitner
ATTORNEYS

INVENTOR.
ALBERT W. ZEMEK
BY
Fidelman, Wolffe & Leitner
ATTORNEYS

PATENTED OCT 26 1971 3,616,089

INVENTOR.
ALBERT W. ZEMEK
BY Fidelman, Wolffe & Leitner
ATTORNEYS

PREPPER-TAPER MACHINE FOR ELECTRICAL COMPONENTS

This invention relates to an apparatus for taking unprocessed electrical components, straightening and forming their leads in preparation for future attachment to a printed circuit board and the like. To accomplish this the apparatus, after forming the component leads in the correct orientation, places each oriented transistor between continuous ribbons of adhesive tape with equal spacing and then winds the taped transistors and an interliner on a reel.

A major problem involved in handling electrical components from manufacture to assemblage on a circuit board has been the time and labor involved in orienting the component leads in the proper position.

Another problem has been in handling the components from the time the leads have been properly oriented to the time they are attached to the circuit board. Any pressure applied to the leads during this time period will distort them. Distorted lead components are usually rejected since the automated insertion machinery and solder baths will not accommodate them. The machines will jam and the soldered connection will not be correct if the leads are not aligned in their proper orientation.

Still another problem involved in handling electrical components has been the added handling of the components after lead orientation and before securing them for shipment, such as by taping the leads. Two machines have been used up till now; one to orient the leads and the other to process the components for shipment.

It, therefore, is an object of this invention to provide an apparatus for orienting the leads of manufactured electrical components into proper position and then place them between continuous ribbons of adhesive tape prior to shipment.

It is a further object of this invention to provide an apparatus which will automatically straighten and orient the leads of electronic components, count them, feed them between wheels carrying continuous adhesive tapes and wind them on a reel.

Still another object of this invention is to provide an apparatus which will prepare and tape electrical components automatically in one operation, thus eliminating the risks of separate handling between the preparation stage and the taping operation.

These and other objects will become apparent from the following description, reference being had to the accompanying drawings wherein preferred forms of the present invention are clearly shown.

Figure 1:
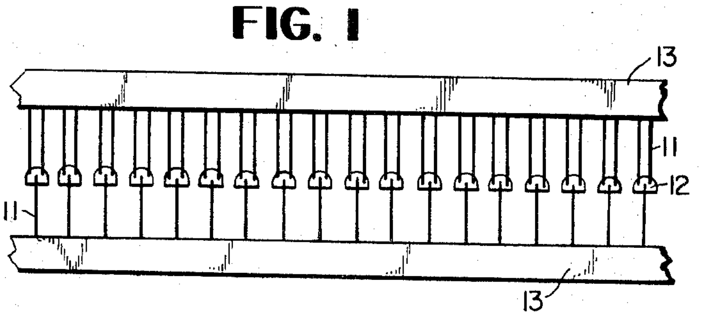
FIG. 1 is a view of the electrical components with their leads oriented and sealed between continuous ribbons of adhesive tape.

The apparatus receives components to be processed from any suitable feed means, such as a vibratory bowl. The components slide under the force of gravity down a feed chute to a position in the transfer mechanism.

The transfer mechanism is mounted on a die block which is mounted on the front of the apparatus for sliding horizontal movement. Also mounted on the die block are male-straightening and lead-forming dies. Opposite the die block is a stationary block which has female straightening and forming dies mounted thereon for mating with their male counterparts. A component-carrying indexing chain is mounted on the front of the apparatus and, on its downward travel, moves between the blocks. The transfer mechanism engages each component at the base of the feed chute and transfers it to the chain where it is received by one of a series of C-shaped clips mounted on each chain link. The chain indexes and another component is received in another clip, etc. As the portion of the chain carrying the components moves past the dies, the dies, in synchronous movement with each other and the transfer mechanism, straighten and form the component leads.

The indexing chain is mounted on upper and lower semicircular chain guides which have channels therein for receiving the chain. The chain is indexed by the vertical reciprocal movement of a slide casting which, on its upward stroke, engages a rod connected to the indexing mechanism and frees the chain as the slide casting starts downward. A spring forces the chain down, thus indexing it one position.

The slide casting receives its power from an eccentric crank and a motor. The casting slides on two vertical rods. Mounted on the casting is a spring-biased plunger which contacts a spring-biased push rod to eject components from the chain onto the taping wheels.

Mounted just below the bottom of the chain are two taping wheels. They are journaled on a shaft which has a clutch housing at one end and an indexing ratchet wheel on the other end. A handwheel for manual rotation of the shaft is also mounted on this end and is used when attaching the ribbons of tape. The taping wheels are spaced apart so that the body of the component rests between the wheels and the leads of the component contact the adhesive surfaces of the tape.

When the slide casting reaches the lowermost point of its downward stroke, the push rod is activated. The component at this time has its leads wedged into the notches of transfer members. The transfer members are mounted against rotation on a shaft for rocking movement and are biased in the upward direction. The push rod engages one member which rotates the members and shaft downward, thus pulling the component body from its position in the C-shaped clip and placing the ends of the leads onto the adhesive surfaces of the tapes which are wound around the taping wheels. Since the taping wheels are indexing in a direction away from the notch openings of the transfer members, the component leads are pulled out of the notches before the transfer members are rotated upwardly by the action of the slide casting allowing the push rod to return to its normal position.

The taping wheels index in synchrony with the chain by the action of a projection on the base of the slide casting hitting an index arm, which in turn, cocks an arm carrying the ratchet pawl. The pawl-carrying arm is biased so that when the index arm returns to its normal position upon upward movement of the slide casting, the taping wheels are indexed.

Directly below the taping wheels are a set of pitch wheels also carrying ribbons of tape with their adhesive sides up. The pitch wheels rotate in a direction counter to the taping wheels. The pitch wheels are tangential to the taping wheels so that the adhesive surfaces of the tapes on the pitch wheels contact, seal the component leads therebetween and are wound on reels with an interliner.

DETAILED DESCRIPTION

Figures 2, 19:
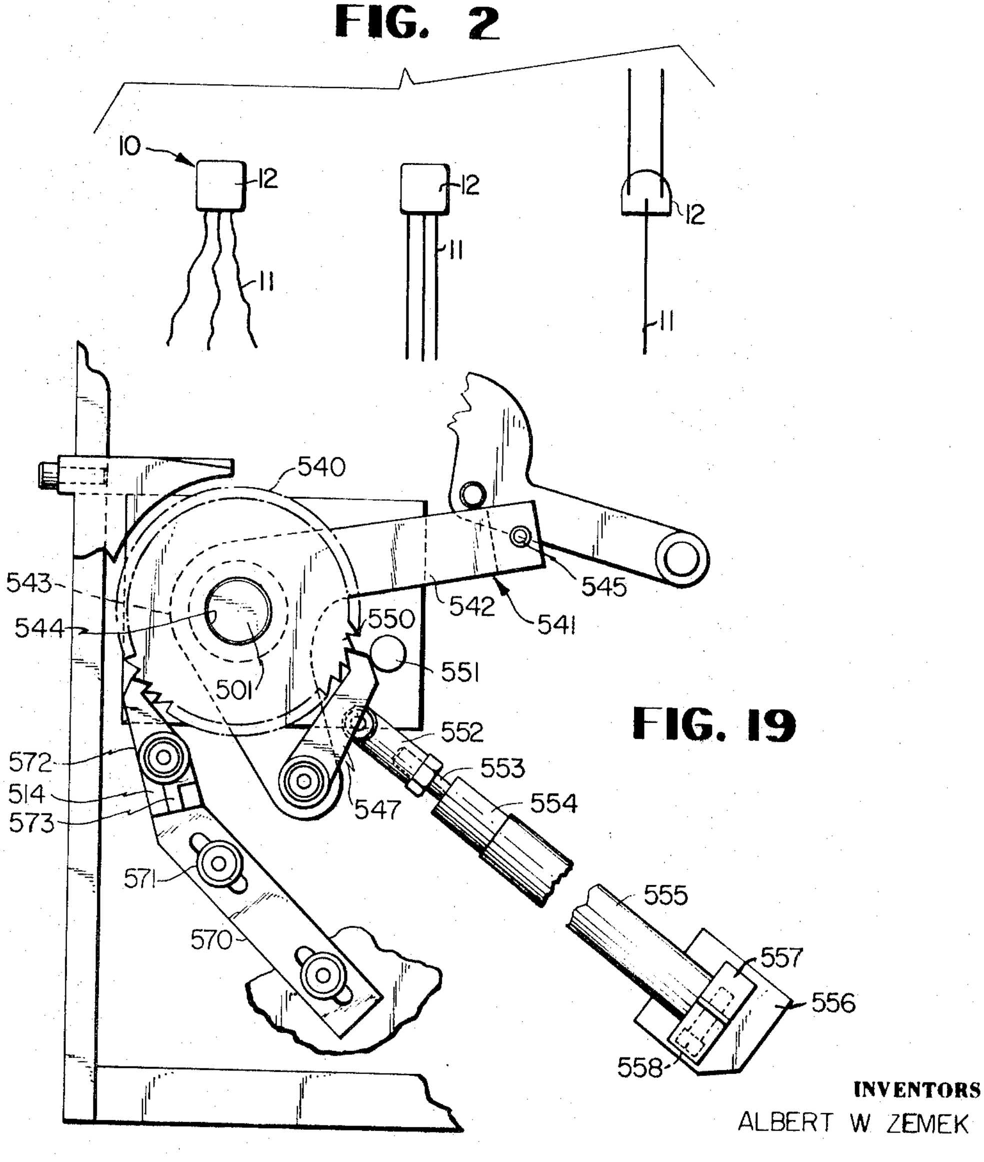
FIG. 2 shows views of an electrical component. The views showing the unprocessed and straightened components are side views and the formed view is a bottom view.
FIG. 19 is a side view of the indexing wheel and its accompanying ratchet arm.

Referring to the drawings, FIG. 2, there is illustrated an unprocessed component 10 with its leads 11 extending from a body 12. The leads may be bent or crinkled in the unprocessed state as shown. After straightening, the leads 11 are substantially parallel to each other and generally perpendicular to the base of the component body. The forming operation bends the leads near their base until they are substantially parallel to the component base surface.

FIG. 1 shows components with their leads held between ribbons 13 of adhesive tape. Each ribbon 13 consists of two layers of adhesive tape with their adhesive surfaces contacting one another. The components are shipped in this form and the tape is stripped with the prior to the soldering operation to place the components on a printed circuit board. The leads may also be cut adjacent the tape.

THE SUPPORT APPARATUS

Figure 3:
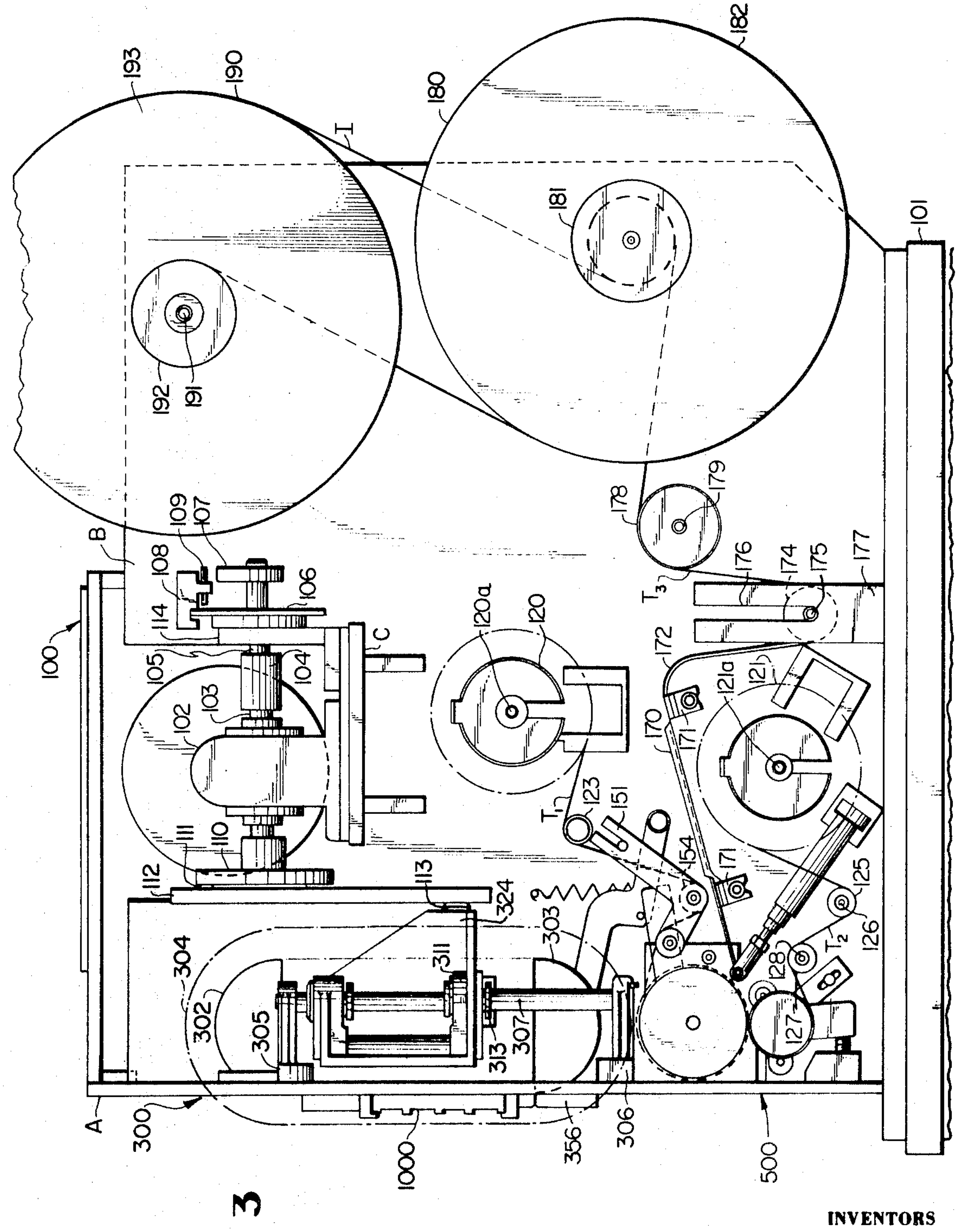
FIG. 3 is a side view of the prepper-taper apparatus showing the various components thereof.

Referring to FIG. 3, the apparatus is generally designated by 100. It consists of a support base 101, a vertical frame member A, the end of which is seen in FIG. 3, and a side frame member designated as B. The transfer and chain assembly is designated by 300. The taping mechanism is shown beneath the transfer and chain assembly and designated as 400. The power means employed by the unit consists of a motor 102 driving a shaft 103. Coupled to shaft 103 by coupling member 104 is timing shaft 105. Mounted on shaft 105 is timing plate 106 and a timing hand 107. These timing members act in conjunction with timing mechanism 108 which contains microswitch 109 to control the operation of motor 102. It automatically controls the feed of components from a source and shuts off motor 102 when the last component has been processed. Mounted on the other end of shaft 103 is an eccentric plate 110 having an eccentric pin 111 which is connected to a crank arm 112. Crank arm 112 is pivotally connected at its other end to slide mechanism 301 by pin 113. The motor 102 is mounted upon auxiliary support member C and bracket member 114 in which the shaft 105 is journaled is also mounted on member C.

Figure 18:
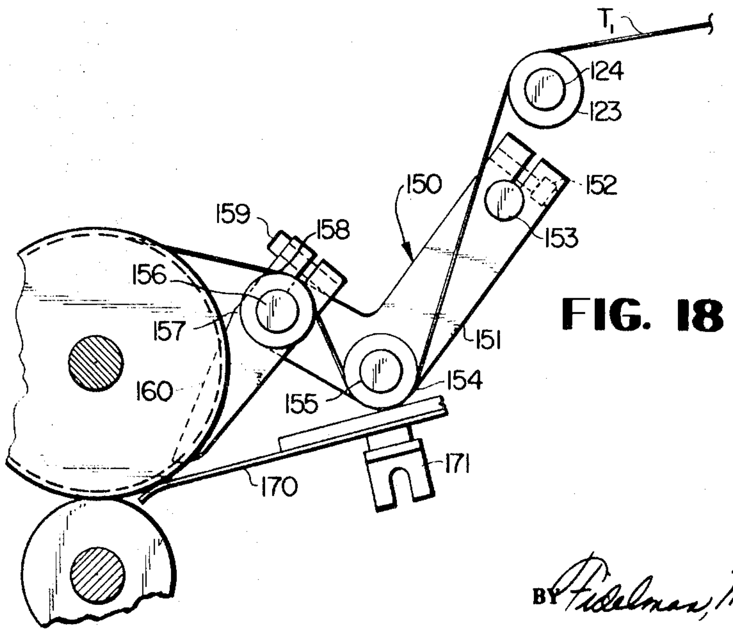
FIG. 18 is a side view of the biasing arm carrying a ribbon of adhesive tape to the taping wheels.

Mounted on sidewall B are tape reels 120 and 121 which hold a supply of tape with its adhesive side exposed. Reels 120 and 121 are mounted on shafts **120*a* and 121*a*. There is a second set of reels mounted on these shafts but they are not shown in FIG. 3. Thus, each shaft has two reels for carrying rolls of tape. The ribbons of tape from the rollers on shaft 120*a*, generally designated as T1 are fed to the taping mechanism 500 over roller 123 which is mounted on shaft 124 and through a tape-tensioning mechanism designated as 150. This is best illustrated in FIG. 18. Tensioning mechanism 150 consists of a tensioning arm 151 securely mounted by bolt 152 to a rotatable shaft 153. Tension arm 151 is generally L-shaped as shown in FIG. 18 and has a tape roller 154 mounted in the angle portion thereof on stud 155. Mounted on the other end of arm 151 is stud 156 which contains a rider bar 157 and a tape roller 158. Rider bar 157 is securely fastened to stud 156 for nonrotative movement by bolt 159. Rider bar 157 has a tapered surface 160 which rides on the surface of spacer 515 of the taping mechanism 500**.

The ribbons of tape, generally designated as T2 from the reels mounted on shaft **121*a* pass over rollers 125 mounted on shaft 126 and rollers 127 mounted on shaft 128 to the pitch wheels 526 and 525 of taping mechanism 500**.

The taped component, generally designated by T3 exit from the taping mechanism 500 up guide member 170 which is fastened through brackets 171 to side member B. Guide member 170 consists of a flat planar section terminating in a curved end portion 172. The tape components T3 then pass under weighted roller 174, the shaft 175 of which is mounted in slots 176 of bracket member 177. The taped components T3 then pass over roller 178 which is mounted on shaft 179 and then to drum 180. Drum 180 consists of a small diameter spool 181 and large diameter circular flange members 182. The taped components T3 are wound around spool member 181 with an interliner I. The interliner is fed from a supply drum 190 mounted on shaft 191. The drum 190 also has a spool section 192 and large diameter flange members 193. As is indicated by the dotted lines in FIG. 3, the taped components T3 and the interliner I are simultaneously wound on drum 180. This is to insure that the wound components do not engage one another, the interliner being between layers of tape components.

Figures 21, 22:
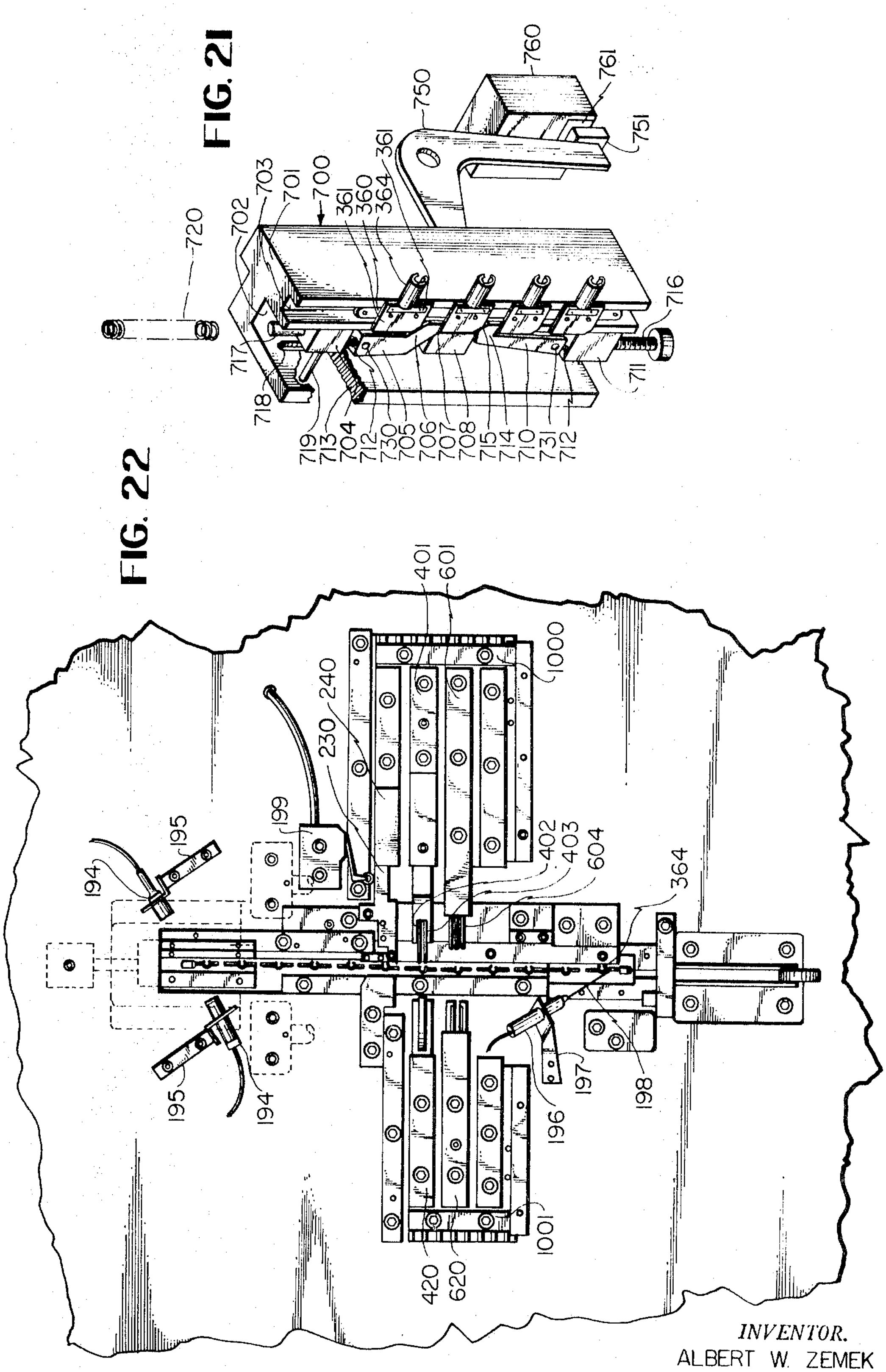
FIG. 21 is a perspective view of the mechanism which indexes the chain.
FIG. 22 is a front view of the slide blocks showing the transfer member and the straightening and forming dies.

Referring to FIG. 22, a front view of the apparatus is shown. An electric eye mechanism 194, mounted on brackets 195 counts the components as they slide down the feed chute prior to entering the transfer mechanism. A relay 196 is mounted below the blocks 1,000 and 1,001 by bracket 197. A rigid wire 198 extends from the counter down to the area where the processed components are transferred from the chain to the taping wheels. The leads of the components hit wire 198 which activates relay 196. If there is no component in the chain clip, relay 196 activates air cylinder 555 retracting pawl 547. This action prevents the taping wheels from indexing. Thus, there is no gap left in the strip of taped components.

FIG. 22 shows the relative locations of the transfer mechanism 200, the lead-forming means 400 and the lead-straightening means 600. A microswitch and roller 199 counts the movement of transfer mechanism 200.

FEED ASSEMBLY

Figure 12:
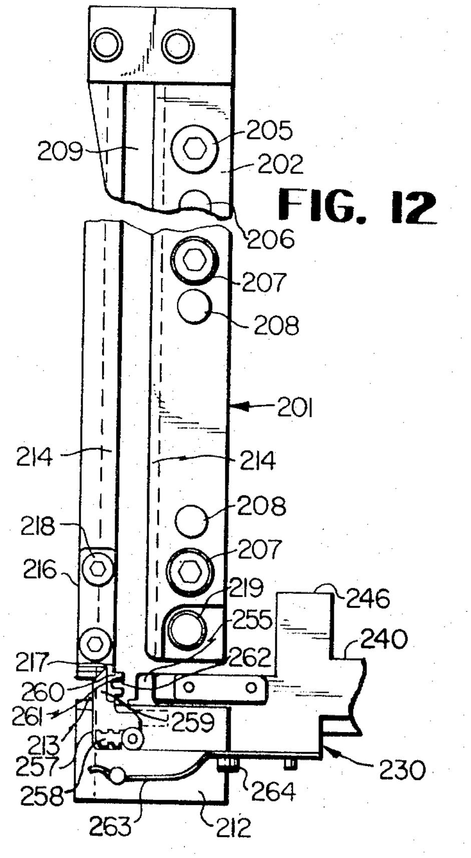
FIG. 12 is a front view of the component transfer mechanism showing the feed slide.

The components are fed from a magazine or a vibratory bowl down a feed chute (not shown) into a feed track and transfer mechanism 200 which moves the components laterally into C-shaped spring clips on the index chain. Feed track 201 is shown in FIGS. 12, **12*a* and 13. It consists generally of a back plate 202 with two guide plates 203 and 204. The guide plates are secured to the back plate by bolt 205 and dowel 206. The plates are bolted to the vertical frame member A by bolts 207 and dowels 208. The plates form a slot 209 down which the components slide, their leads projecting out of the slot. Plate 202 has a lower portion 210 connected to 202 by a reduced area portion 211. A plate member 212 is secured to the front of portion 211 and spaced below the bottom edges of plates 202 and 203 to form a slot 213**.

The adjacent edges of plates 202 and 203 are undercut as at 214 so that the component will not fall out as it rides down the slot. The area at the bottom of slot 209 is termed a nest 215.

Figure 13:
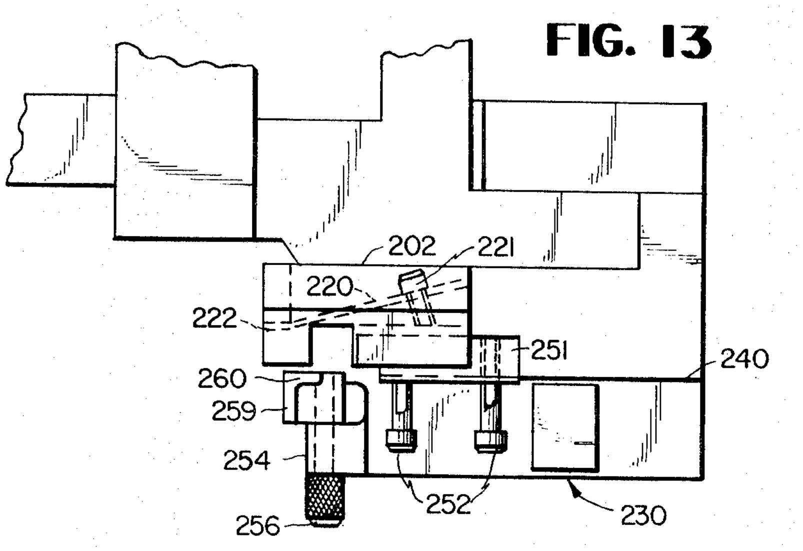
FIG. 13 is a plan view of the component transfer mechanism shown in FIGS. 12 and 12A.

A block member 216 is mounted on the front of the bottom of plate 203 by bolts 218. On the inside front corner of block member 216 is a projection 217. At the bottom of guide plate 204 is a stop pin 219 which projects through both plate 204 and back plate 202. Looking at FIG. 13, it can be seen that a spring 220 is mounted on the rear of portion 211 by machine screw 221. The flattened end portion 222 of spring 220 extends along the back of slot 215 for a purpose to be later described.

Mounted in the die block 1,000 for lateral sliding movement across the front of feed track 201 is transfer mechanism 230 consisting of a housing 231 having an extension 232 adapted to be connected to a power source (not shown) such as a pneumatic or hydraulic cylinder. Housing 231 consists of a main portion 233 with a rectangular slide channel 234 in the top thereof. A smaller rectangular push rod channel 235 is cut into the bottom surface of channel 234. A cover 236 is secured to the top of portion 233 by bolts 237. Cover 236 is slotted at 238 and 239 and the portion 240 between the slots is bent down as at 241 to provide a support for dowel 242. A cutaway portion 243 extends lengthwise across the plate and narrower than the width of channel 234.

Mounted within channel 234 is slide bar 240 of generally rectangular configuration and having a rectangular lug 241 on its bottom surface adapted to ride in channel 235. Portion 233 has a hole which projects up into channel 235 and is fitted with a stop pin 243. The inner end of slide bar 240 is drilled at 244 to receive one end of compression spring 245. The other end of spring 245 is fitted around stud 242. The purpose of spring 245 in relation to the operation of the transfer mechanism will be later described.

Figure 15:
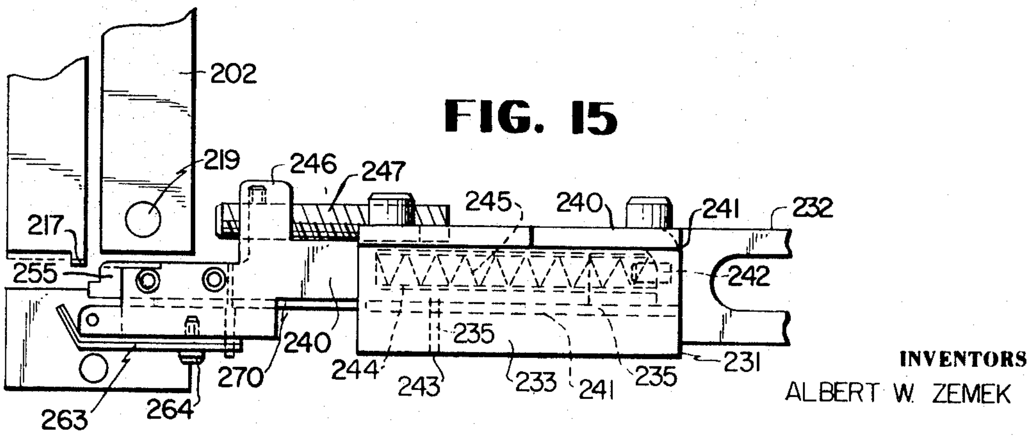
FIG. 15 is a side view of the component transfer mechanism of FIG. 14.

As seen in FIG. 15, slide bar 240 has a rectangular projection 246 which carries an adjustable threaded stop member 247. Member 247 is adjustable by inserting a screwdriver or like tool in the slot 248 at the end thereof.

Figure 12A:
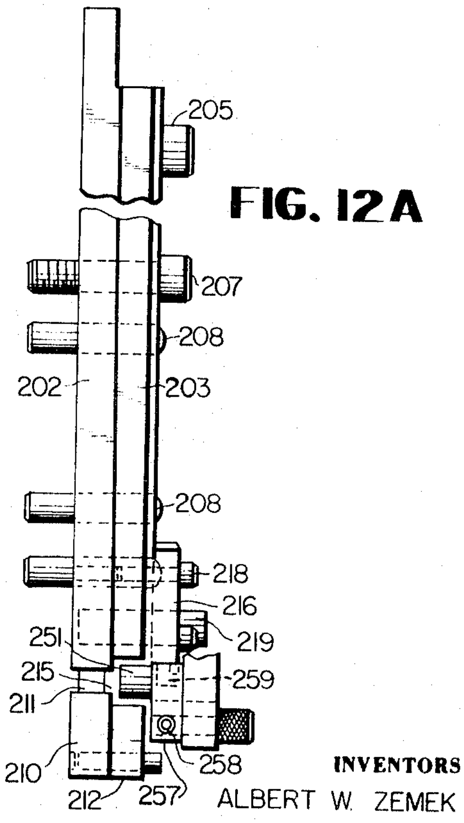
FIG. 12A is a side view of the component transfer mechanism shown in FIG. 12.
Figure 14:
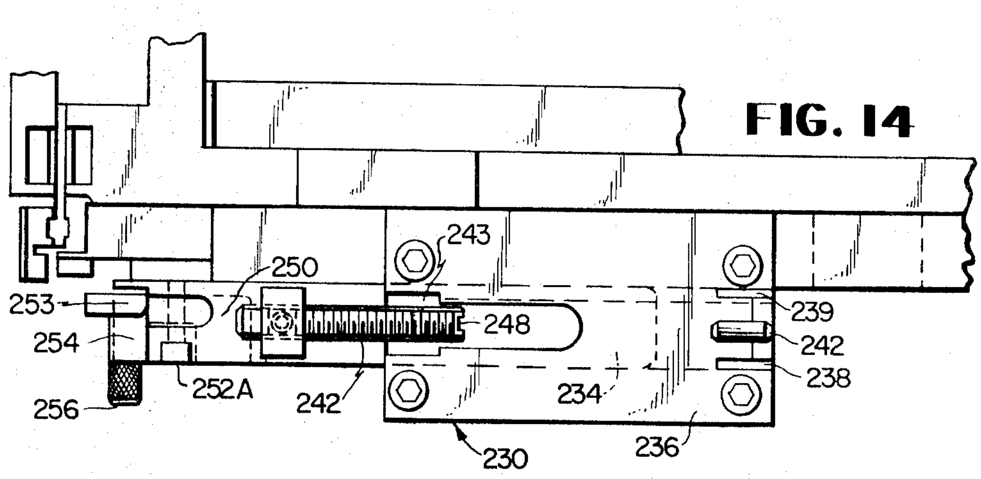
FIG. 14 is another plan view of the component transfer mechanism with the latch removed and showing more of the power slide.

A component carrying section 250 is located on the end of slide 240. It is an essentially rectangular portion with a block member 252 mounted on the inner side thereof by bolts 252. The leading edge of 250 is cut away as at 253 leaving projection 255. Projection 255 is adapted to act in conjunction with the latch member to grip the leads of a component. Nest block 254 is bored to receive a latch pin 256. Mounted on latch pin 256 is latch 257 which is held against relative rotation by setscrew 258. Latch 257 has a stop portion 259 which is configurated to coact with projection 217 of member 216. Adjacent stop portion 259 is gripping portion 260 which has a leading edge 261 with a slot 262 therein adapted to coact with projection 255. Mounted on the bottom of section 250 by bolts 264 is spring 263, shown prior to bending to final shape in FIGS. 14 and 15, and bent to final shape in FIGS. 12, 12*a*, and 13. Spring 263 biases latch 257 closed.

As the transfer mechanism commences to slide toward the chain, latch 257 closes firmly on the component leads. As the mechanism continues to slide the component body snaps into a portion 364 of a spring clip.

At approximately the same instant in time, the end of stop member 247 hits stop pin 219 whereupon movement of slide bar 240 and section 250 ceases. The housing 231 continues to move forcing stop pin 243 to engage a push rod 270 mounted in channel 235 of housing 231 and in bar 271 of section 250.

Rod 270 is then forced out against latch 257 and forces it back against the biasing action of spring 263. At this point the chain indexes and the transfer mechanism returns to its initial position to receive another component.

When the mechanism slides over to place a component body in a spring clip 362, the body of the component engages portion 222 of spring 220 which forces it up against the inner surfaces of latch 257 and member 255. Block member 251 passes through slot 213 to clear it of any broken component portions.

TRANSFER AND CHAIN ASSEMBLY

The transfer assembly consists of a main transfer mechanism 300 shown in FIGS. 3, 4, 4*a* and 5. A slide mechanism 301 is located on vertical frame member A. The transfer mechanism also includes upper and lower chain guide assemblies, 302 and 303 respectively, and a chain 304.

The slide mechanism 301 is mounted to vertical frame member A by support pieces 305 and 306. Both support pieces are bolted to the frame member A or attached thereto in any suitable manner and extend inwardly therefrom. Attached to and between the end portions of pieces 305 and 306 is vertical shaft 307. Slide 308 is mounted upon shaft 307 for vertical sliding movement thereon. Slide 308 generally consists of a plate member 309 with flange portions 310 and 311 extending horizontally at a right angle. Flange portions 310 and 311 contain bushings 312 and 313 enabling slide 301 to move vertically on shaft 307. An L-shaped extension portion 314 on slide 308 has a stop 315 mounted at the end thereof for engaging an abutment member (not shown) on vertical frame member A.

Mounted on top of flange portion 310 is a block member 316 secured thereto by fasteners such as bolts 317. Mounted in block member 316 is a tubular housing 318 having a closed top 319 and an open bottom end. Telescoped into the bottom of housing 318 for sliding movement therein is a second tubular housing 320 of smaller diameter than housing 318 and having a closed bottom 321 and an open upper end. The open end of housing 318 is designed so as to prevent housing 320 from falling out. The feature can be a slight inward taper or a small flange. The upper open end of housing 320 has a flange 322 which coacts with such a feature. Mounted within the housings and abutting their respective closed ends is a compression spring 323. The housings coact in conjunction with spring 323 to force a rod 331 in the lower chain guide assembly 303 downwardly to transfer the component onto the taping wheels in a manner later to be described.

Figures 4, 4A, 5, 6, 6A:
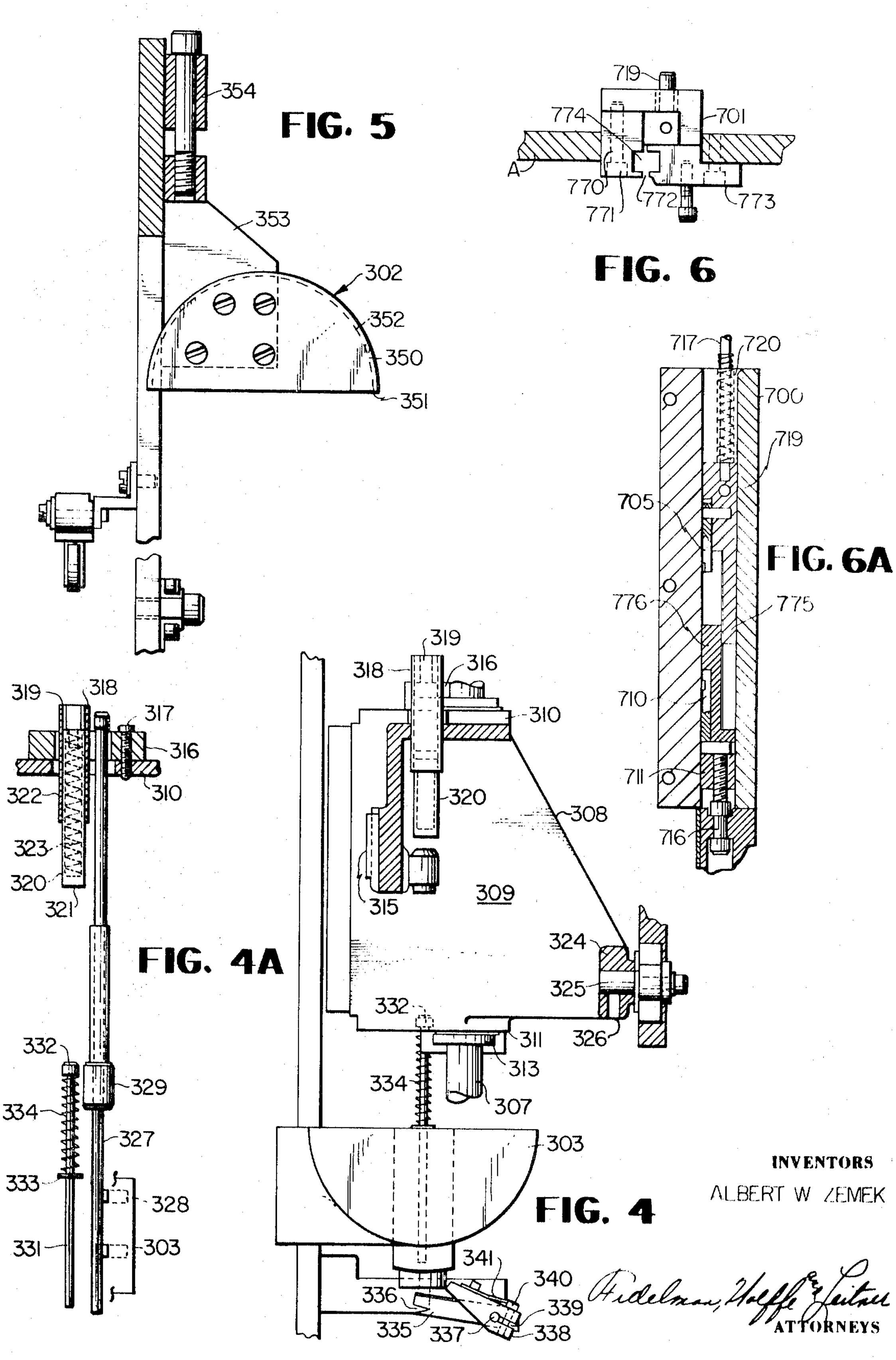
FIG. 4 is a side view of the chain drive indexing mechanism showing the slide in cross section.
FIG. 4A is a partial cross-sectional front view of the slide assembly and push rods.
FIG. 5 is a side view of the upper chain guide assembly.
FIG. 6 is a partial sectional plan view showing the chain indexing mechanism.
FIG. 6A is a side cross-sectional view of the indexing mechanism which indexes the chain one position for each downward stroke of the slide.

As shown in FIG. 4, at the inner extremity of plate 309 is a flange member 324 which is drilled or cast to receive a stud 325. Stud 325 is held against rotation in member 324 by means of a setscrew 326. Stud 325 connects slide 308 to the end of a crank arm which connects said slide to the drive mechanism for reciprocal vertical movement.

Located adjacent housing 318 in block 316 is a two-piece rod 327, as shown in FIG. 4*a*. The bottom of the rod is firmly secured to lower chain guard 303 by setscrews 328. A connector 329 secures the two portions of rod 327 together. Rod 327 insures against rotation of slide 308 during the reciprocal movement thereof. The top of rod 327 is not secured to the slide 308 but merely passes through an aperture 330 in flange 310 and block 316.

Lower chain guide 303 is drilled to receive a second rod member 331 for vertical sliding movement therein. A plug 332 is secured to the top of rod 331. Surrounding rod 331 between plug 332 and a washer 333 on chain guide 303 is a compression spring 334. Rod 331 is aligned with housings 320 and 318 and the distance between lower end 321 of housing 320 and plug 332 is slightly less than the total downward stroke of slide 308. Thus, as slide 308 nears the end of its downward stroke, end 321 of the housing hits plug 332 and forces rod 331 downwardly against a transfer member 335 which has a notch 336 engaging the leads of a component. There are two members 335, one on each side of the chain 304 and, as the chain rotates, the formed leads of a component engage notches 336 and disengages the component from chain 304. Members 335 are mounted for pivotal movement about shaft 337 which is secured to support piece 306. Also mounted on rod 337 for nonrotative movement are stops 338 which have a slotted end 339 with a bolt 340 firmly securing the stops to shaft 337. A spring 341 is secured to stop 338 by a screw and is biased against members 335 tending to force the notched ends upwardly.

Upper chain guide 302, as seen in FIG. 5, consists of an arcuate portion 350 having flanges 351 on either side and a flat arcuate surface 352 therebetween for the chain to ride in. Portion 350 is connected to yoke 353 which is slideably mounted on vertical fame member A. Block 354 is mounted directly above yoke 353 and is drilled to receive an adjustment bolt 355 which passes therethrough and into yoke 353. Thus, by adjusting bolt 355, the tension in chain 304 can be controlled.

Lower chain guide 303 is identical to guide 302 except that it is mounted directly to the vertical frame member A by portion 356 in any suitable manner (see FIG. 4).

Figures 11, 11A:
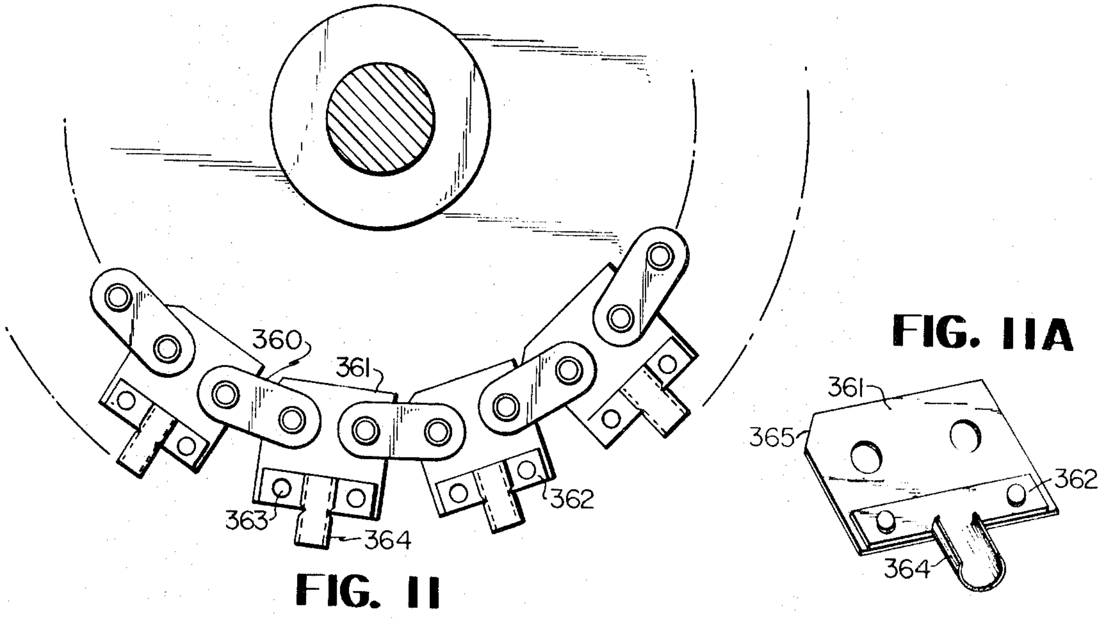
FIG. 11 is a side view of the component indexing chain.
FIG. 11A is a perspective view of one of the links of the component indexing chain showing the component carrying clip mechanism.

Chain 304 is a continuous chain with links 360 joined by means of rivets to connecting plates 361. It is understood that there is a link 360 on each side of connecting plates 361. Each plate 361 has a spring clip 362 mounted thereon by means of rivets 363. Clips 362 have a center portion 364 which is circular and projects outwardly therefrom. Portions 364 are adapted to receive the component or transistor body. In FIG. 11*a* it can be seen that portion 364 is open on one side thereof. The purpose of this is to allow transfer mechanism 200 to push the body of the transistor into the portion 364.

Referring now to FIGS. 6, 6*a* and 21, the indexing mechanism 700 will be described in detail. A casting 701 is mounted in a vertical slot in vertical frame member A. A second casting 770 is bolted to 701 by means of bolts 771. A channel 703 in casting 701 and channel 774 in casting 770 form a slideway for the chain. A slot 772 is provided between the front edges of the castings to allow clips 364 to protrude therethrough. The links 360 ride in the channels with plates 361 therebetween. Located directly behind channel 703 in casting 701 is a second larger channel 702. Two camming members 704 and 711 ride in channel 702.

Member 704 is generally rectangular with a stepped relieved area on one side thereof. A camming pawl 705 is mounted for pivotal movement about a pin 730 on the first part of the relieved area. Pawl 705 has a projection 706 which is configurated to mate with a beveled area 365 on chain plates 361. It also has a straight edge 707 which wedges against the opposite edge of plates 361. Extending from the top of member 704 is a stud 717. A spring member 720 is adapted to surround stud 717 and biases member 704 downwards. Mounted on the back side of member 704 in slot 718 is a rod 719. Stop member 315 on slide 308 engages under rod 719 on its upward stroke.

Member 711 is mounted below member 704 in a fixed position within channel 703. It, too, has a relieved area in which is mounted pawl 710 by pin 731. The pawl is mounted for pivotal movement. Pawl 710 has a projection 714 thereon with a beveled edge 715 adapted to mate with a beveled edge 365 on chain plates 361. Portions 775 and 776 of members 704 and 711, respectively, are adapted to slideably engage one another. Mounted on the bottom of member 711 is an adjustment screw 716 for fixing the position of member 711, as shown in FIG. 6A.

Both pawls 705 and 710 are biased for engaging the chain by springs 712 which tend to force projections 706 and 714 into the areas between the chain plates. As the member 704 rides upward due to the action of stop member 315 against rod 719, pawl 705 is forced out of its position shown in FIG. 21 and is pivoted downward. When projection 706 of pawl 705 reaches the next gap between plates 361, spring 712 forces the projection up and into engagement with the adjoining plates. As the slide 308 goes down and stop 315 breaks its engagement with rod 719, the spring 720 forces member 704 downward until it encounters fixed member 711. This action also forces the chain to index down one position. As the chain is indexed down, thus carrying the components through their processing positions, the beveled edges 365 of plates 361 pivot pawl 710 down due to the sliding action on edge 715. When the next gap between plates 361 is low enough, spring 712 biases pawl 710 and its projection 714 up into engagement in the gap thus locking the chain against further movement.

STRAIGHTENING AND FORMING MECHANISM

Figure 7:
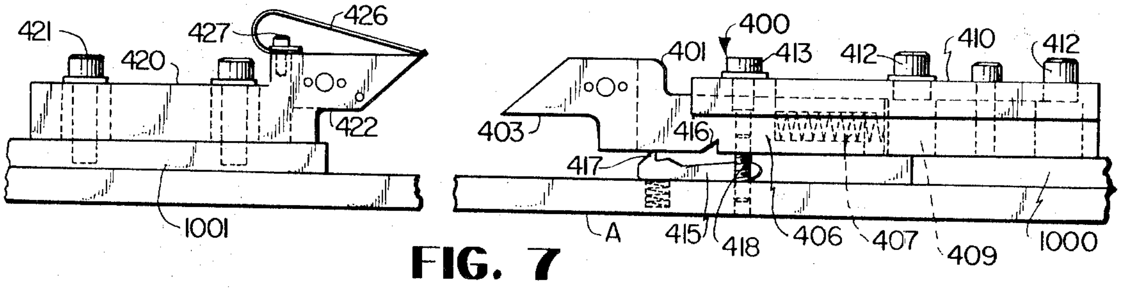
FIG. 7 is a side view of the straightening dies.
Figure 8:
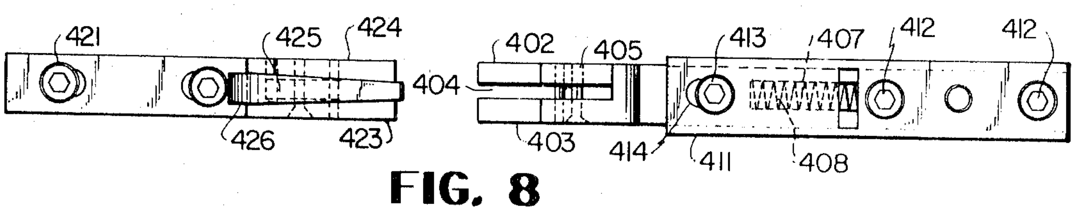
FIG. 8 is a plan view of the straightening dies shown in FIG. 7.
Figure 9:
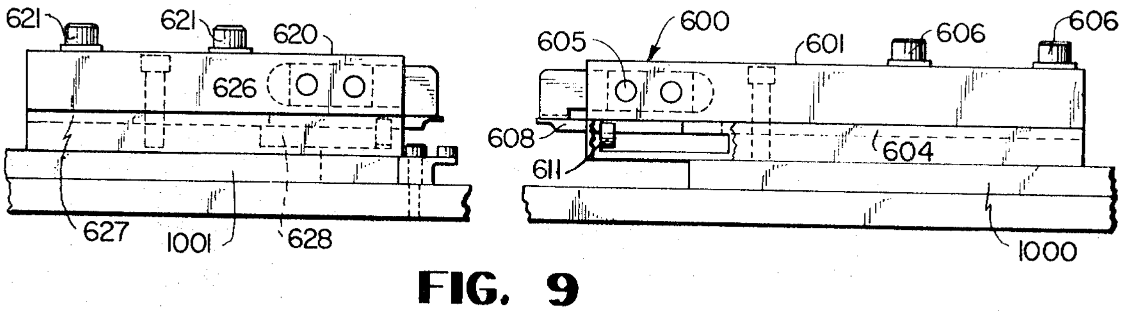
FIG. 9 is a side view of the forming dies.

The straightening apparatus is shown generally as 400 in FIGS. 7 and 8. The mechanism consists of a slotted head portion 401 having tapered sections 402 and 403 separated by slot 404. Section 403 is integral with portion 401 and section 402 is attached to section 403 by screws 405. Portion 401 has an extension portion 406 which is channeled as at 407 to receive compression spring 408. The other end of compression spring 408 abuts against block 409. A cover member 410 having flanges 411 is mounted atop block 409 and portion 401. Member 410 is secured to block 409 by bolts 412. Bolt 413 passes through a slot 414 in member 410 and into portion 401. A spring biased catch member 415 is secured to frame member A to prevent overextension of portion 401. Portion is slidable relative to member 410. Portion 401 has a notch 416 adapted to engage projection 417 on catch member 415.

Catch member 415 has an aperture 418 through which passes stud 419 which, in turn, is mounted within frame member A. Slidable die block 1,000 is slotted so that it passes on each side of catch member 415. Portion 401 advances, projection 417 engages notch 416, stops the advance of portion 401 and the remaining portion of the straightening die including block 409 mounted on work holder 1,000 acts against compression spring 408 and stops.

Mounted by bolts 421 on stationary die block 1,001 opposite portion 401 is member 420. It has a blade-receiving portion 422 with integral tapered section 423 and separate tapered section 424. The sections are separated by a slot 425 shown in dotted lines in FIG. 8. A spring member 426 is mounted atop portion 422 by bolt 247.

Both portions 401 and 422 are adapted to receive intermeshing straightening blades (not shown). These blades are conventional in the component processing industry and are not shown nor discussed.

Mounted directly below lead-straightening mechanism 400, which is mounted in groove 1,005 (FIG. 3) in work holder 1,000, is lead-forming mechanism 600. It consists of a blade holder 601 mounted in groove 1,006 of slidable work holder 1,000. Blades 602, 603 and 604 are held in holder 601 by machine screws 605. Member 601 is secured to slidable work holder 1,000 by bolts 606. There are spacers 607 located between the blades to maintain spaces between the blades. Sliding member 608 is located within channel 609. A projection 610 depends downwardly from member 608 and rides in auxiliary channel 611.

Figure 10:
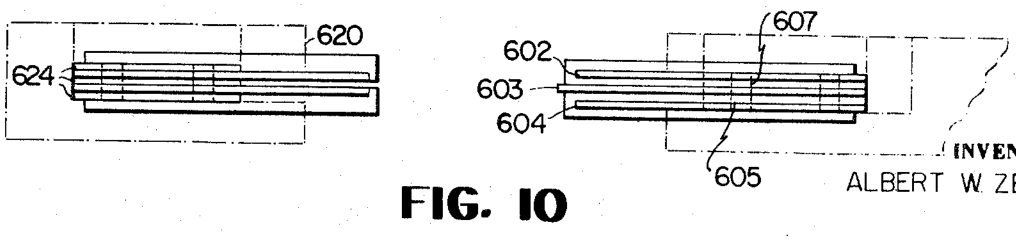
FIG. 10 is a plan view of the forming dies shown in FIG. 9.

Located opposite holder 601 is blade holder 620 which is mounted on stationary die holder 1,001 by bolts 621. Blades 622 and 623 are secured in holder 620 between spacers 624 by machine screws 625 as shown in FIG. 10. A sliding member 626 is mounted in channel 627 for sliding movement therein. Projection 628 limits the amount of travel of member 626 by its travel within auxiliary channel 628. A slot 629 is located in the center portion of member 626.

Sliding members 626 and 608 advance until they abut against the base of the leads and the component. The blades continue and mesh thus bending the leads over at right angles and in opposite directions. In the embodiment shown, two leads are bent in one direction and one lead in the other direction.

TAPING MECHANISM

Figure 16:
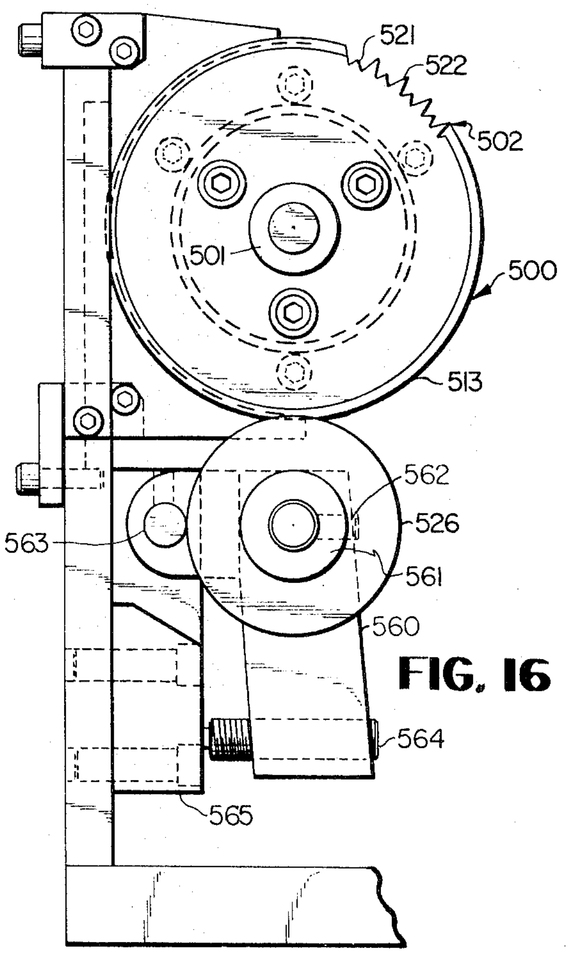
FIG. 16 is a side view of the taping wheels.
Figure 17:
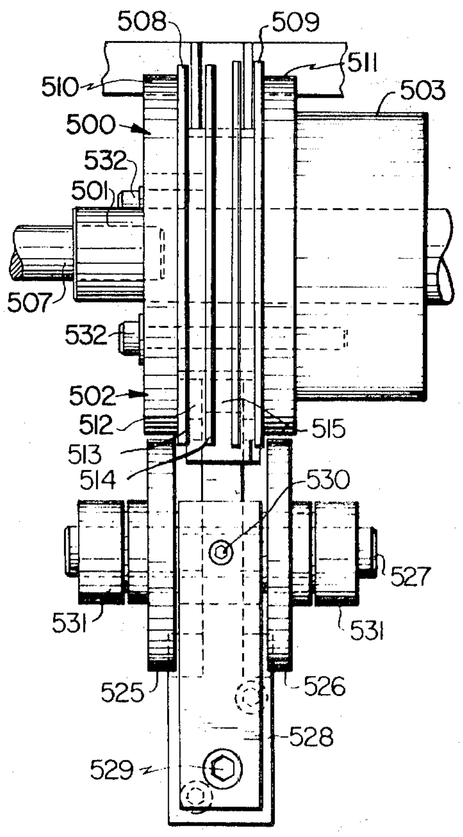
FIG. 17 is a front view showing the taping wheels of FIG. 16.

The taping mechanism is designated generally as 500 in FIGS. 3, 8, 17 and 19. It consists of a shaft 501 mounted on the frame member A on which is mounted a pitch and pressure wheel assembly 502, a spacer 503, an index wheel 504, a plate 505, a clutch housing (not shown), and a handwheel extension shaft 507. Looking at FIG. 17, assembly 502 is shown as an assemblage of two toothed wheels 508 and 509 mounted on shaft 501 between two taping wheels 510 and 511. These plates are held together as a unit by bolts or machine screws (not shown). The component body locates between the toothed wheels with the axial leads in grooves or notches 520 in the teeth of the wheels. Each toothed wheel consists of a spacing portion 512 between two larger diameter toothed sections 513 and 514. The pitch wheels are separated by a spacing wheel 515 mounted on shaft 501. The toothed sections have teeth 520 such as shown in partial view in FIG. 16. As is apparent from the drawing, a smaller tooth 521 is located between each of the larger teeth 522. This is to accommodate the two parallel-spaced leads extending from the component body. The other toothed sections 513 and 514 have only single sized teeth (not shown) to accommodate the one lead extending in the opposite direction. Of course, for only two lead components, all toothed sections would have single sized teeth.

Located directly below and almost in contact with the taping wheels 510 and 511 are pitch wheels 525 and 526. The pitch wheels carry ribbons of adhesive tape (not shown) which contact the lead carrying tapes on the taping wheels and seal the ends of the leads therebetween. The pitch wheels are mounted on shaft 527 which is mounted by means of bracket 528 and bolts 529 to frame member. Bracket 528 is mounted to shaft 527 by means of screw 520. Located adjacent pitch wheels 525 and 526 are spacers 531.

Spacer 503 is connected to wheels 510, 511, 508 and 509 and spacers 513 and 515 by means of bolts 532. Located at the other end of spacer 503 is a clutch housing and mechanism (not shown) which allows the taping and toothed wheels to be rotated by a handwheel (not shown) on the end of shaft 507 and for a second purpose to be described.

Also on shaft 501 is an indexing ratchet wheel 540 shown in FIG. 19. Secured to shaft 501 also is a ratchet arm 541. Ratchet arm 541 has a straight section 542, a curved portion 543 which has an aperture 544 therein for mounting the arm on shaft 501 for rotation thereof and a pawl section 546. A stud 545 extends from the side of portion 542 for a purpose to be described later. Pawl section 546 carries a pawl 547 thereon which engages teeth 550 on wheel 540. Located adjacent the extremity of pawl 547 is a pawl stop 551. Abutting pawl 547 and biasing it is an adjustable yoke 552. Yoke 552 is threadably and adjustably mounted by means of threaded member 553 to telescoping members 554 and 555. Member 554 is telescoped within member 555, which is an air cylinder. When the relay 196 (FIG. 22) does not sense a component ready to be transferred onto the taping wheels, it activates air cylinder 555 which then retracts. The retraction of cylinder 555 takes pawl 547 out of engagement with teeth 550 and the taping wheels 510 and 511 do not index. This is to insure that there is no gap in the ribbon of taped components. Cylinder 555 is anchored to the base member by means of flange plate 556, member 557 and bolt 558.

Pitch wheels 525 and 256 are mounted on shaft 561 which, in turn, is mounted in angle member 560. Angle member 560 is mounted for pivotal movement about shaft 563 at one end and has an adjustment bolt 564 on the opposite end. The purpose of bolt 569 is to adjust the tangential spacing between pitch wheels 525 and 526 and taping wheels 510 and 511. Adjustment bolt 564 rests against stop member 565.

A bracket member 570 is secured to the apparatus by bolts 571 and carries on one end a pawl support 574. A pawl 572 is pivotally mounted on support 574 and is biased by spring member 573 against taping wheel teeth 550. A projection 575 on the end of pawl 572 engages teeth 550, thus preventing counter rotating of the taping wheels.

MODIFIED EMBODIMENT

Figures 20, 23:
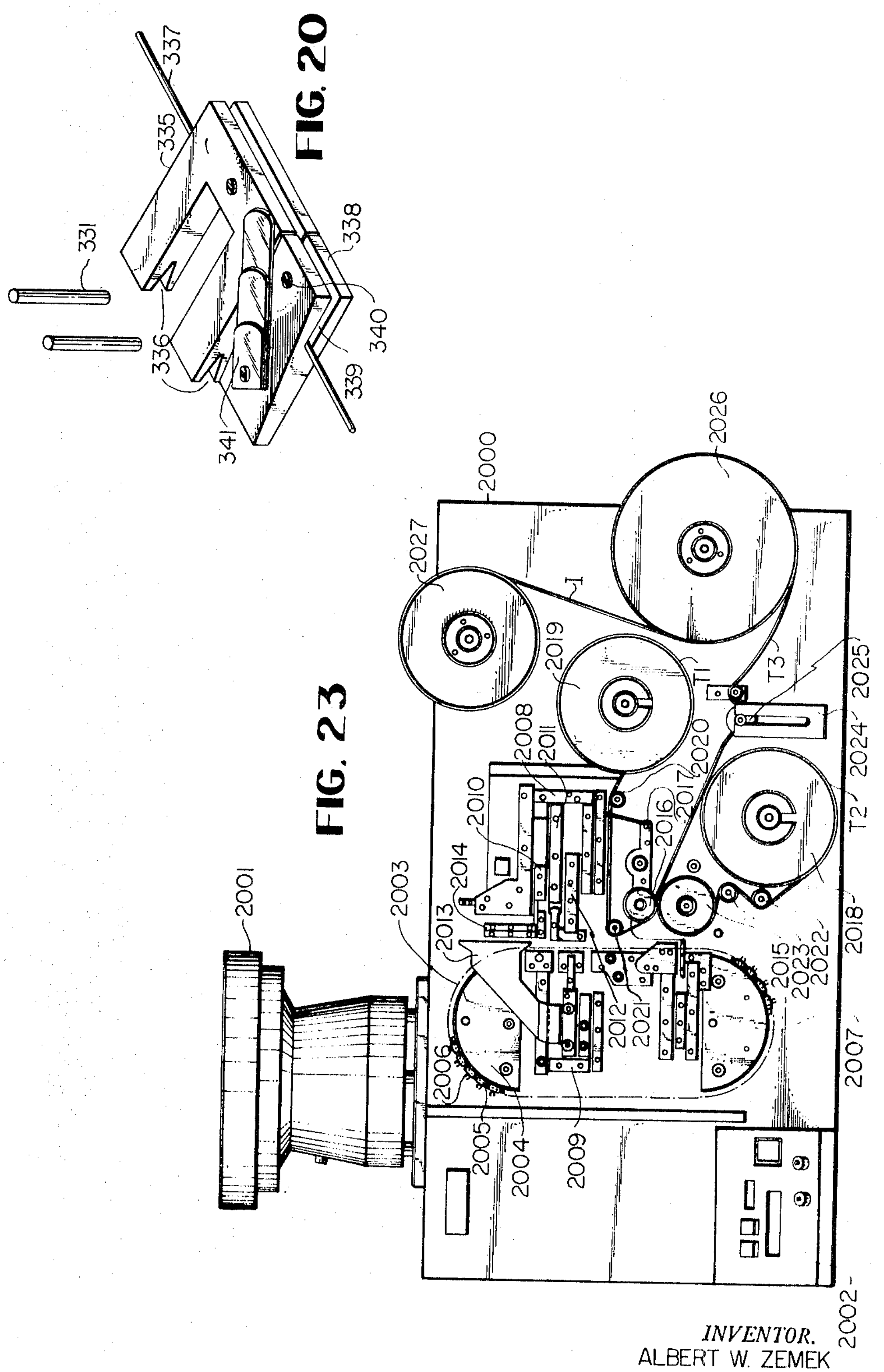
FIG. 20 is a perspective view of the mechanism which transfers the components from the index chain to the taping wheels.
FIG. 23 is a front view of another embodiment of the apparatus.

FIG. 23 shows a modified embodiment of the apparatus designated as 2,000. It is used when the leads of a component are adapted to extend in only one direction from the component body. It consists of a vibratory feed bowl 2,001 mounted atop the apparatus 2,000. A control panel 2,002 is positioned in one corner of the device. A chain 2,003 is mounted in a coplanar fashion with the front plate of the apparatus. It moves on guides 2,004 and 2,007 and has carrier members 2,005 with clips 2,006 for carrying a component with the leads protruding out from the apparatus.

Slide blocks 2,008 and 2,009 are mounted on each side of a portion of the chain and carrying transfer mechanism 2,010, straightening members 2,011 and forming members 2,012. A bracket member 2,013 is adapted to receive a component feed track (not shown). The feed track connects with a feed track assembly 2,014.

The ribbons of adhesive tape $T_1$ and $T_2$ are fed from reels 2,018 and 2,019 over idler rollers 2,015, 2,020, 2,021 and 2,022 to taping wheel 2,015 and pitch wheel 2,016. Pitch wheel 2,016 is mounted on adjustment member 2,017. The tape $T_3$ carrying the components goes under weighted roller 2,023 mounted in slot member 2,024, over an idler wheel and onto reel 2,026. An interliner I is fed from reel 2,027 to be wound on reel 2,026 with the taped components.

What is claimed is:

1. An apparatus for processing the leads extending from the bodies of electronic components and taping said leads between ribbons of tape comprising: support means, component carrier means mounted for predetermined incremental movement on said support means, said carrying means comprising an endless chain with spring clip means thereon for grasping said component bodies, means to advance said carrier means, means for receiving components from a source, transfer means adapted to move said components from said receiving means onto said carrier means, means for processing said components leads as said carrier means advances said components incrementally, tape-carrying means adjacent said carrier means, said tape-carrying means having means advancing it by predetermined increments, means to eject said components from said carrier means and to place the component leads on the adhesive surface of the first tape carried by said tape-carrying means, and means to apply sealing tape over the first tape, whereby the individual components are spaced and their leads are sealed between layers of tape.

2. The apparatus of claim 1, wherein said means for receiving components comprises a feed chute which has a first channel portion and a narrower open channel portion, the first channel portion adapted to slideably receive component bodies with the component leads projecting through said narrow open channel portion.

3. The apparatus of claim 1, wherein said spring clip means comprise C-shaped resilient portions adapted to grasp the component bodies.

4. The apparatus of claim 1, wherein said component lead-processing means comprise means for straightening and forming the component leads.

5. The apparatus of claim 1, wherein said means for ejecting the components from the carrier means comprises a spring-biased plunger rod which is activated by the means advancing said carrier means.

6. The apparatus of claim 1, wherein the tape carrying means comprises a pair of rotatable taping wheels each adapted to receive a ribbon of tape with an adhesive side exposed whereby said component leads contact the exposed adhesive surface.

7. An apparatus as in claim 6, wherein said means applying sealing tape over said taped leads comprises a pair of pitch wheels located beneath and aligned respectively with said taping wheels and rotatable in a direction opposite to said taping wheels, said pitch wheels adapted to receive ribbons of tape with an adhesive side exposed whereby the exposed surfaces of the tapes adhere together to seal the component leads between them.

8. An apparatus as in claim 6, wherein each of said taping wheels include toothed discs mounted on the facing sides of two taping wheels, the teeth on said discs adapted to receive said component leads whereby the leads are guided onto the exposed adhesive surfaces of the tapes on the taping wheels.

9. An apparatus for processing the leads extending from the bodies of electronic components and taping said leads between ribbons of tape comprising: support means, component carrier means mounted for predetermined incremental movement on said support means, means to advance said carrier means, means for receiving components from a source, transfer means adapted to move said components from said receiving means on to said carrier means, means for processing said component leads at said carrier means advances said components incrementally, said component lead-processing means comprising means for straightening and forming the component leads, said transfer means and said lead straightening and forming means being mounted on a movable die block, said die block having means whereby said block moves through a complete cycle for each increment of movement of the component carrying means, tape-carrying means adjacent said carrier means, said tape-carrying means having means advancing it by predetermined increments, means to eject said components from said carrier means and to place the components leads on the adhesive surface of the first tape carried by said tape-carrying means, and means to apply sealing tape over the first tape, whereby the individual components are spaced and their leads are sealed between layers of tape.

10. An apparatus for processing the leads extending from the bodies of electronic components and taping said leads between ribbons of tape comprising: support means, component carrier means mounted for a predetermined incremental movement on said support means, means to advance said carrier means, said carrier advancing means including a vertically reciprocatable slide member, said slide member activating a follower mechanism on its downward stroke to advance the component carrier means, means for receiving components from a source transfer means adapted to move said components from said receiving means onto said carrier means, means for processing said component leads as said carrier means advances said components incrementally, tape-carrying means adjacent said carrier means, said tape-carrying means having means advancing it by predetermined increments, means to eject said components from said carrier means and to place the component leads on the adhesive surface of the first tape carried by said tape-carrying means, and means to apply sealing tape over the first tape, whereby the individual components are spaced and their leads are sealed between layers of tape.

11. The apparatus of claim 10, wherein the means for processing said component leads is activated by the vertical reciprocal motion of said slide member.

12. The apparatus of claim 10, wherein said means for ejecting said components from the carrier means is activated by the slide member on its downward stroke.

13. An apparatus for straightening and forming the leads of electrical components and then taping the component leads onto ribbons of tape to form a length of spaced components, said apparatus comprising a support means including a vertical frame plate, component delivery means mounted on a first side of said plate, an endless component carrying means mounted on the other side, reciprocating means mounted on said other plate side to index said carrying means a predetermined amount with each cycle of said reciprocating means, a slidable block means mounted on said first plate side and having cam means connecting it with said reciprocating means to activate it with each cycle of the latter, a stationary block means on said first plate side opposite said slidable block means, a slot in said plate between said block means, a portion of said endless carrier means extending through and down the width of said slot, transfer means mounted on said slidable block means and adapted to transfer components from said component delivery means to said carrier means with the leads of said components extending away from and substantially perpendicular to said first plate side, straightening and forming means mounted on both of said block means, said forming means adapted to orient each component's leads in opposite colinear directions substantially parallel to the plane of the plate member, rotatable means carrying ribbons of tape with exposed adhesive surfaces, means associated with said reciprocating means to eject a component from said carrier means, an intermediate means adapted to place said component leads onto the exposed surfaces of said tape, means to apply additional tape to said tape ribbons carrying said components to seal the component leads between the layers of tape, and means to wind the component carrying ribbons onto a drum.

14. An apparatus as in claim 13, wherein said endless component-carrying means comprises an endless chain, said chain having resilient clip means thereon for grasping component bodies.

15. An apparatus as in claim 13, wherein the reciprocating means comprises a casting member, said casting member having a projection thereon, a curved slot in said slidable block means receiving said projection whereby upon reciprocating movement of said casting member, said block slides to activate said transfer means and said straightening and forming means.